United States Patent
Jenq

[11] Patent Number: 6,017,788
[45] Date of Patent: Jan. 25, 2000

[54] METHOD OF FABRICATING BIT LINE

[75] Inventor: Jason Jenq, Pingtung, Taiwan

[73] Assignee: United Microelectronics, Corp., Taiwan

[21] Appl. No.: 08/941,085

[22] Filed: Sep. 30, 1997

[30] Foreign Application Priority Data

Jul. 5, 1997 [TW] Taiwan ................................ 86109477

[51] Int. Cl.$^7$ .............................................. H01L 21/8242
[52] U.S. Cl. ........................................... 438/239; 438/255
[58] Field of Search ..................................... 438/238, 239, 438/253, 254, 396, 397, 647, 648, 649, 653, 655, 656, 657

[56] References Cited

U.S. PATENT DOCUMENTS

| | | | |
|---|---|---|---|
| 5,413,950 | 5/1995 | Chen et al. | 437/52 |
| 5,776,833 | 7/1998 | Chen et al. | 438/672 |
| 5,801,425 | 9/1998 | Kuroi et al. | 257/383 |

*Primary Examiner*—Joni Chang

*Attorney, Agent, or Firm*—Rabin & Champagne, P.C.

[57] ABSTRACT

A method of fabricating a bit line comprises first that a semiconductor substrate is provided. The substrate comprises source/drain regions and a semiconductor structure. Over the substrate, an oxide layer conformal to the semiconductor substrate and a BPSG layer are formed. A contact window is formed and exposes the source/drain regions in the substrate. A polysilicon layer is formed within the contact window and connects the source/drain regions. A titanium silicide (TiSi$_2$) is formed and covers the polysilicon layer. A titanium nitride layer is formed and covers the titanium silicide layer. One of the characteristics of the invention is that a titanium silicide layer, a titanium nitride layer, and a polysilicon layer replaces the conventional tungsten silicide and the polysilicon layer to form a bit line. Therefore, the contact resistance of the bit line is reduced effectively. In addition, the titanium nitride layer can be used as a bottom anti-reflection layer to avoid the necking phenomenon while coating photoresist. Moreover, the titanium nitride layer also prevents the formation of cracking during the subsequent rapid thermal process.

13 Claims, 4 Drawing Sheets

METHOD OF FABRICATING BIT LINE

BACKGROUND OF THE INVENTION

1. Field of the Invention

The invention relates to a method of fabricating semiconductors, and more particularly to a method of fabricating a bit line to reduce the contact resistance thereof.

2. Description of the Related Art

To fabricate a dynamic random access memory (DRAM), a fourth polysilicon layer and a tungsten silicide layer are normally in use as a bit line (BL) to reduce the resistance thereof and to improve the working speed. However, due to the poor step coverage of the tungsten silicide layer, the aspect ratio of DRAM is big, and therefore, the contact between tungsten silicide and the fourth polysilicon layer is incomplete.

The conventional way to improve the contact problem is to use di-cholo-silane to replace silane. A tungsten silicide layer is formed with an improved step coverage by using chemical vapor deposition. However, the step height of the contact window is still as high as 10 KÅ, so that the contact problem between the tungsten silicide and the fourth polysilicon layer cannot be solved effectively.

Referring to FIGS. 1A to FIG. 1F, a cross-sectional view of the fabrication flow of a bit line is shown.

In FIG. 1A, a semiconductor substrate 10 is provided. A source/drain region 9 is formed in the substrate 10. Over the substrate 10, a field oxide layer 11, a first polysilicon layer 12, and a spacer 13 are formed in sequence. The first polysilicon layer 12 is formed by a stack layer of a doped polysilicon layer 16, a tungsten silicide 15, and a silicon nitride layer 14. A TEOS oxide having a thickness of about 1.5 KÅ is formed by low pressure chemical vapor deposition (LPCVD) and covers the field oxide layer 11, the first polysilicon layer 12, and the spacer 13. Using photolithography and etching to define the TEOS oxide, a first oxide layer 17 is formed in a specific region to expose the source/drain region 9 on the substrate 10.

Referring to FIG. 1B, a 5 KÅ thick polysilicon layer which is doped with dopant to increase the conductivity is formed and covers the exposed source/drain region 9 and the first oxide layer 17. A hemispherical silicon grain (HSG) layer is formed on the polysilicon layer. Using photolithography and etching, the polysilicon layer and the hemispherical silicon grain layer are defined to form a second polysiticon layer 18 and a hemishperical silicon grain layer 19. These two layers 18 and 19 are the bottom electrode of the DRAM.

Referring to FIG. 1C, a dielectric layer is formed and covers the exposed hemispherical silicon grain layer 19 and the second polysilicon layer 18. The dielectric layer is a silicon oxide/silicon nitride/silicon oxide (ONO) stacked layer, or a tantalum oxide/titanium oxide layer. The polysilicon layer is doped with dopant to increase the conductivity. Using photolithography and etching to define the polysilicon layer and the dielectric layer, a third polysilicon layer 21 and a dielectric layer 20 are formed. The third polysilicon layer is used as a top electrode of the DRAM.

Referring to FIG. 1D, a second oxide layer 22, a BPSG layer 23 are formed and cover the third polysilicon layer 21 by atmosphere pressure chemical vapor deposition (APCVD). The thickness of the second oxide layer 22 is about 1.5 KÅ, and it is about 7.5 KÅ for the BPSG layer 23.

Referring to FIG. 1E, using photolithography and etching to define the BPSG layer 23, the first oxide layer 17, and the second oxide layer 22, a contact window 24 are formed, and the source/drain region 9 of the substrate 10 is exposed.

Referring to FIG. 1F, a fourth polysilicon layer 25 having a thickness of about 1 KÅ is formed and covers the BPSG layer 23 and the contact window 24. The fourth polysilicon layer 25 is doped with dopant to increase the conductivity. A tungsten silicide ($WSi_x$) layer 26 is formed and covers the fourth polysilicon layer 25. The tungsten silicide layer 26 is formed by LPCVD with reactant gases such as tungsten flouride and tungsten reacted with silane ($SiH_4$) at about 300° C. to 400° C. The bit line is composed by the fourth polysilicon layer 25 and the tungsten silicide layer 26.

However, since the tungsten silicide cannot fill the whole contact window 24, the contact between the tungsten silicide 26 and the fourth polysilicon layer 25 is incomplete. Therefore, the contact resistance of the bit line is increased. Moreover, the reflection coefficient of tungsten silicide is so high that a necking phenomenon is likely to happen while coating photoresist.

SUMMARY OF THE INVENTION

It is therefore an object of the invention to provide a method of fabricating a bit line to reduce the contact resistance thereof.

According to the invention, a method of fabricating a bit line is provided. A semiconductor substrate on which a semiconductor structure and source/drain regions are formed is provided. The semiconductor structure comprises a gate electrode, a bottom electrode, a dielectric layer, and a top electrode. An oxide layer conformal to the semiconductor structure and a BPSG layer are formed over the substrate. Using photolithography and etching, a contact window is formed to expose the source/drain regions in the substrate. A polysilicon layer is formed within the contact window and connects the source/drain regions. A titanium silicide ($TiSi_2$) is formed and covers the polysilicon layer. A titanium nitride layer is formed and covers the titanium silicide layer.

One of the characteristics of the invention is that a titanium silicide layer, a titanium nitride layer, and a polysilicon layer replaces the conventional tungsten silicide and the polysilicon layer to form a bit line. Therefore, the contact resistance of the bit line is reduced effectively.

Another the characteristic of the invention is that the titanium nitride can be used as a bottom anti-reflection coating (B-ARC), thus, the necking phenomenon while coating photoresist can be avoid.

The other characteristic of the invention is that the titanium nitride layer prevents the formation of cracking during subsequent rapid thermal process.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate one embodiment of the invention and together with the description, serve to explain the principles of the invention. In the drawings.

DESCRIPTION OF THE PREFERRED EMBODIMENT

As shown in FIG. 1A to FIG. 1F, the same as the conventional fabricating method described above, a semiconductor substrate comprising a semiconductor structure is provided. The semiconductor structure includes a gate electrode 12, a bottom electrode, a dielectric layer 20, and a top electrode 22. A cross-sectional view of the method of fabricating a bit line in a preferred embodiment according to the invention is shown in FIG. 2A.

Figure 1A:
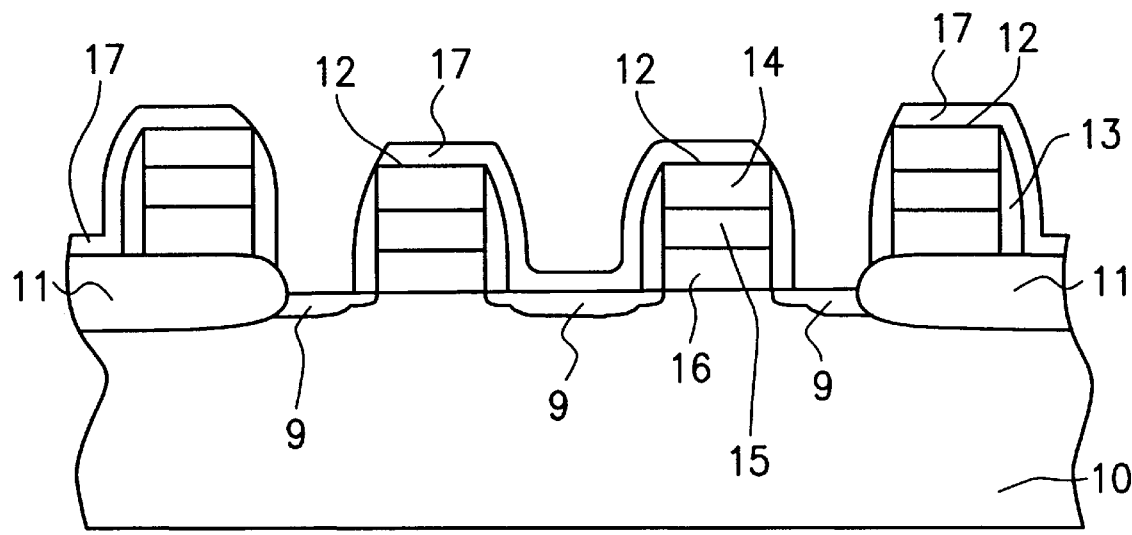
FIGS. 1A to 1F show the cross-sectional view of a conventional fabrication process of a bit line.
Figure 1B:
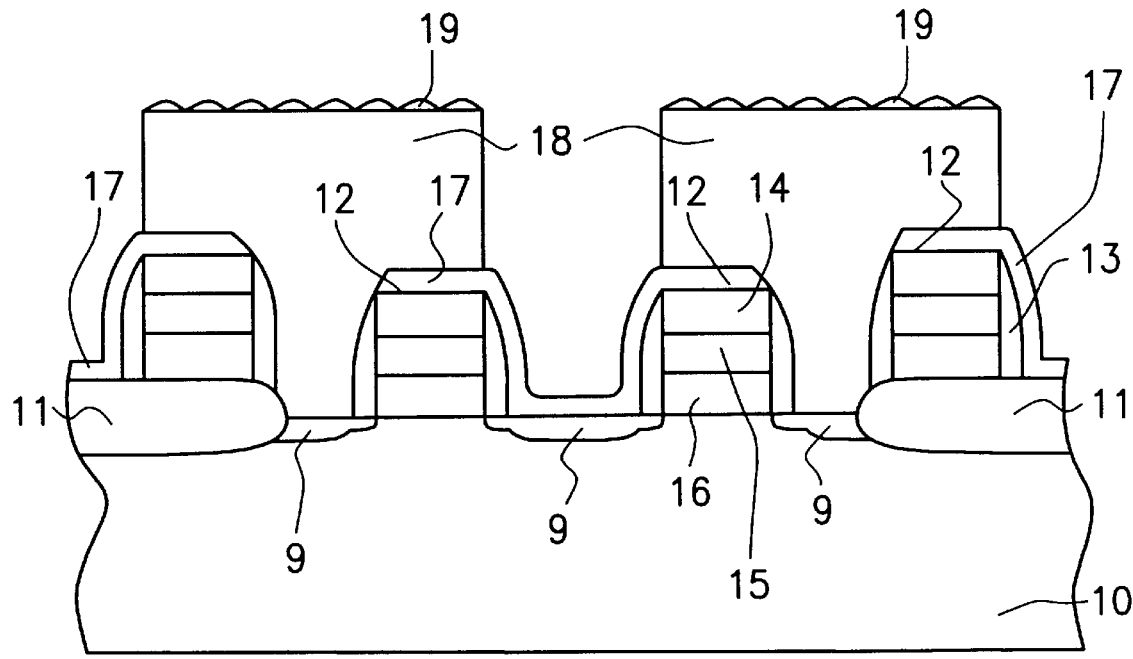
Figure 1C:
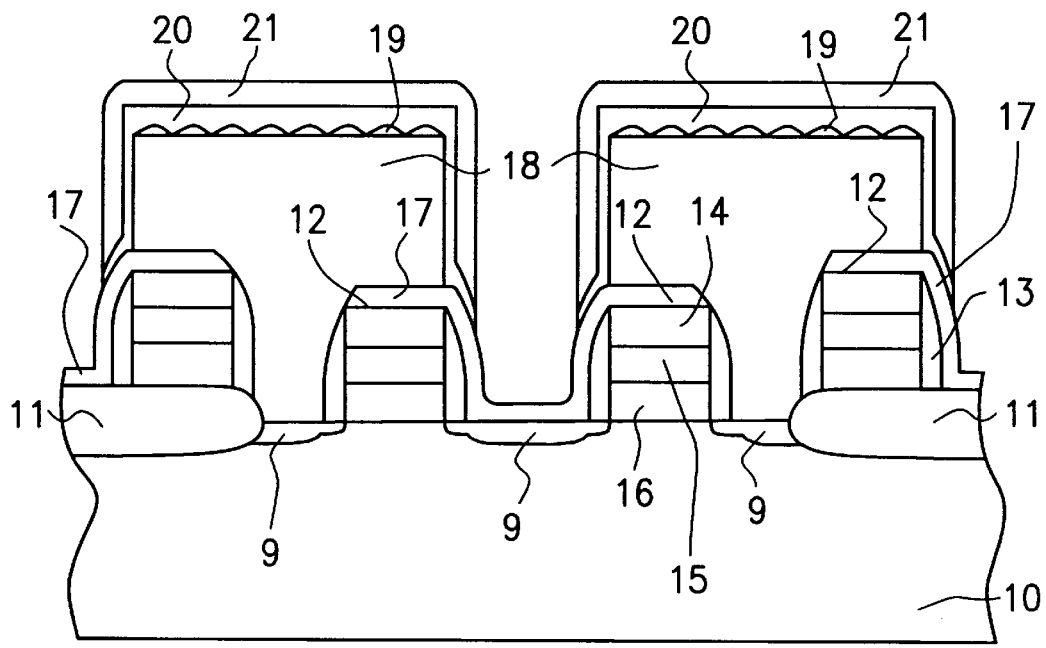
Figure 1D:
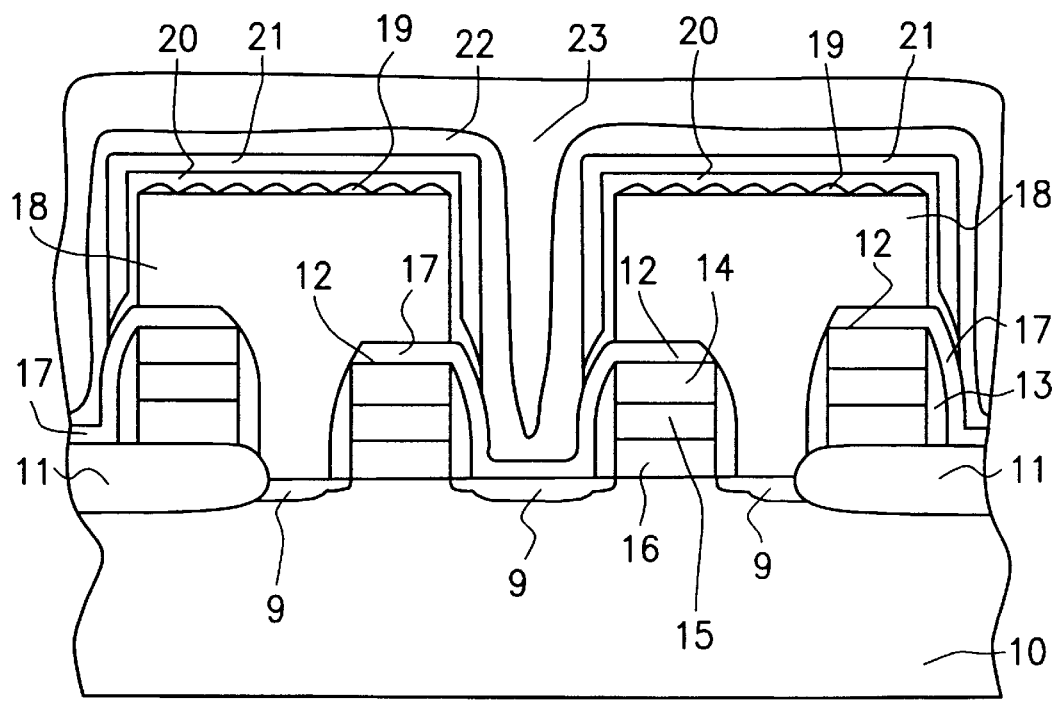
Figure 1E:
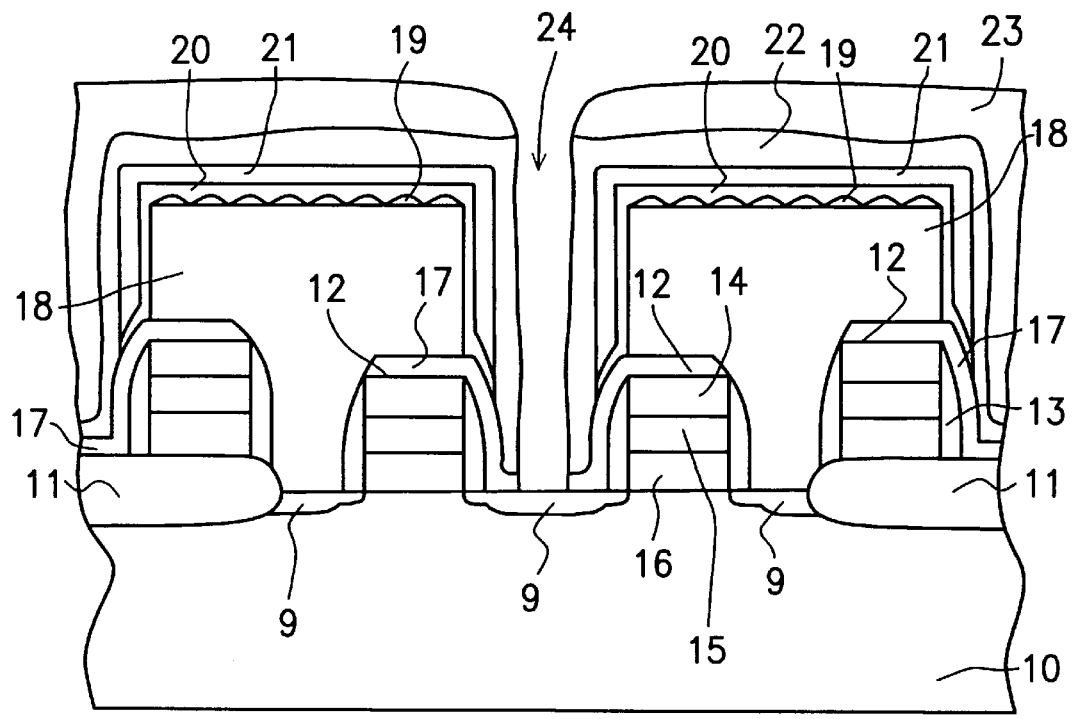
Figure 1F:
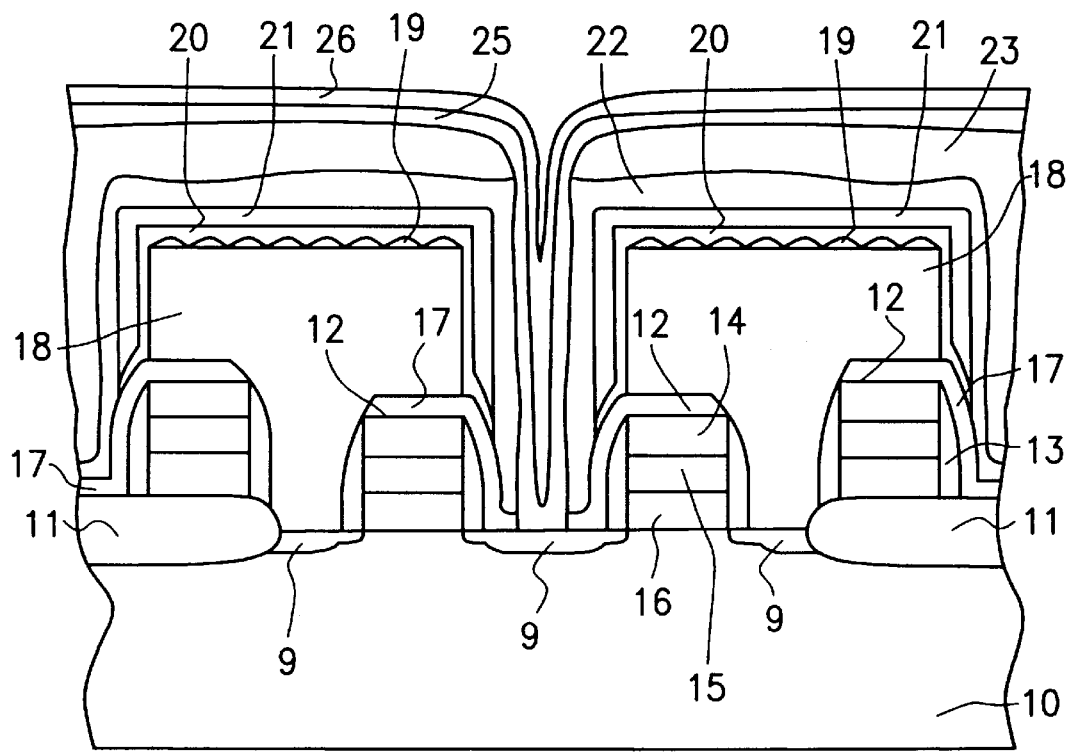
Figure 2A:
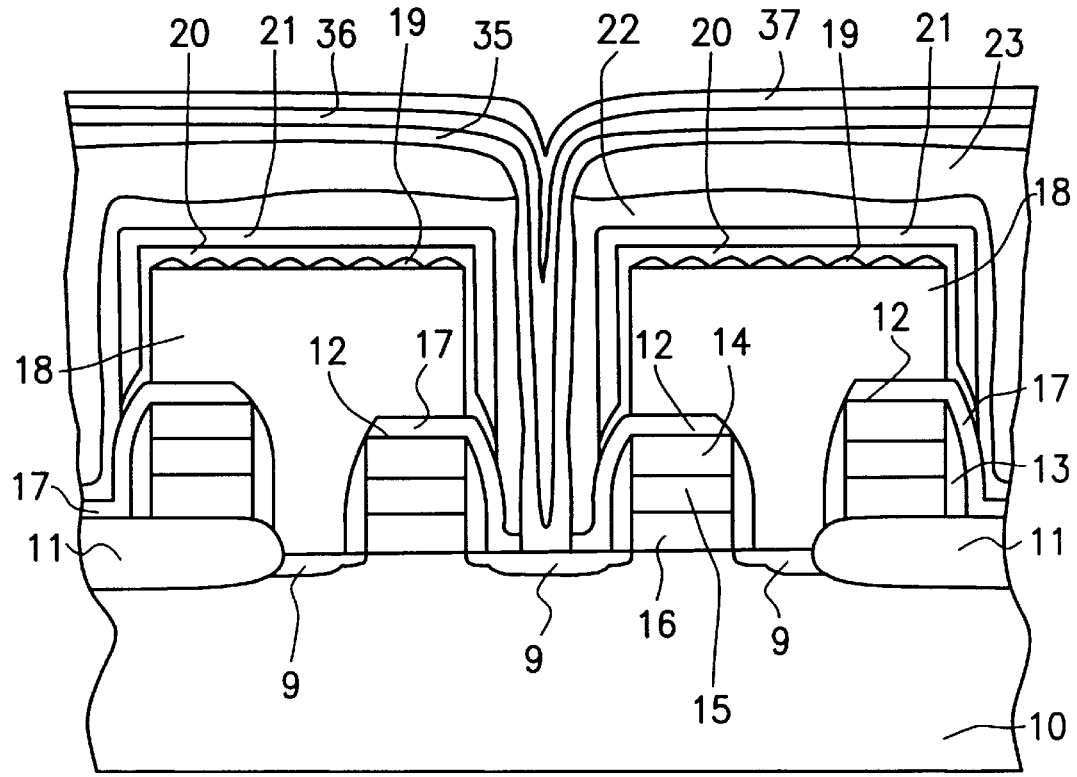
FIG. 2A shows the cross-sectional view of the fabrication process of a bit line in a preferred embodiment according to the invention.

Referring to FIG. 2A, an oxide layer conformal to the semiconductor structure and a BPSG layer 23 are formed over the substrate. Using photolithography and etching, a contact window is formed to expose the source/drain regions. A fourth polysilicon layer 35 having a thickness of about 1 KÅ is formed and covers the BPSG layer 23 and the contact window 24. The polysilicon layer 35 can be doped by dopant to increase its conductivity. The fourth polysilicon layer 35 is formed by LPCVD. A 0.5 KÅ thick titanium silicide layer 36 is formed and covers the fourth polysilicon layer. To form the titanium silicide layer 36, a titanium layer is formed by DC sputtering first, and through a rapid thermal process, the titanium layer is reacted with the fourth polysilicon layer to form a titanium silicide layer 36. The thickness of the titanium silicide layer is about 1.5 KÅ.

A titanium nitride layer 37 is formed with a thickness of about 300 Å. To form the titanium nitride layer 37, a titanium layer is formed by DC sputtering first, and through a rapid thermal process in a nitrogen ($N_2$) or an ammonia ($NH_3$) environment, the titanium layer is nitridized to form a titanium nitride layer 37. The fourth polysilicon layer 35, the titanium silicide layer 36, and the titanium nitride layer 37 compose the bit line of the DRAM.

One of the characteristics of the invention is that a titanium silicide layer, a titanium nitride layer, and a fourth polysilicon layer replaces the conventional tungsten silicide and the fourth polysilicon layer to form a bit line. Therefore, the contact resistance of the bit line is reduced effectively.

Another the characteristic of the invention is that the titanium nitride can be used as a bottom anti-reflection coating (B-ARC), thus, the necking phenomenon while coating photoresist can be avoided.

The other characteristic of the invention is that the titanium nitride layer prevents the formation of cracking during subsequent rapid thermal process.

Other embodiments of the invention will apparent to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a bit line, comprising:
   providing a semiconductor substrate, on which a semiconductor device comprising a plurality of drain/source regions is formed;
   sequentially forming an oxide layer conformal to the semiconductor device and a BPSG layer over the substrate;
   forming a contact window to expose the drain/source region, using photolithography and etching;
   forming a polysilicon layer contacting the exposed drain/source region;
   forming a titanium silicide layer covering the polysilicon layer; and
   forming titanium nitride layer covering the titanium silicide layer;
   wherein the bit line consists of only the polysilicon layer, the titanium silicide layer, and the titanium nitride layer.

2. The method according to claim 1, wherein the semiconductor device further comprises a gate electrode, a bottom electrode, a dielectric layer, and a top electrode.

3. The method according to claim 2, wherein the dielectric layer is an oxide/nitride/oxide stacked layer.

4. The method according to claim 1, wherein forming the titanium silicide layer includes forming a titanium layer, and performing a rapid thermal process such that the titanium layer reacts with the polysilicon layer.

5. The method according to claim 4, wherein the titanium layer is formed by DC sputtering.

6. The method according to claim 1, wherein forming the titanium nitride layer includes forming a titanium layer on the titanium silicide layer, and performing a rapid thermal process in a nitrogen environment, so that the titanium layer is nitridized into the titanium nitride layer.

7. The method according to claim 6, wherein the titanium layer is formed by DC sputtering.

8. The method according to claim 1, wherein forming the titanium nitride layer includes forming a titanium layer on the titanium silicide layer, and performing a rapid thermal process in an ammonia environment, so that the titanium layer is nitridized into the titanium nitride layer.

9. The method according to claim 8, wherein the titanium layer is formed by DC sputtering.

10. The method according to claim 1, wherein the polysilicon layer has a thickness of about 1 KÅ.

11. The method according to claim 1, wherein the titanium silicide layer has a thickness of about 1.5 KÅ.

12. The method according to claim 1, wherein the titanium nitride layer has a thickness of about 300 Å.

13. The method according to claim 1, wherein the bit line is formed without the use of tungsten silicide.

* * * * *